United States Patent [19]
Citta

[11] Patent Number: 5,115,315
[45] Date of Patent: May 19, 1992

[54] DIGITAL VIDEO SIGNAL TRANSMISSION SYSTEM USING REVERSIBLE DISPERSIVE FILTERS

[75] Inventor: Richard W. Citta, Oak Park, Ill.

[73] Assignee: Zenith Electronics Corporation, Glenview, Ill.

[21] Appl. No.: 636,303

[22] Filed: Dec. 31, 1990

[51] Int. Cl.⁵ .................. H04N 7/00; H04N 5/40; H04N 5/222
[52] U.S. Cl. .................. 358/186; 358/188; 358/140; 455/307; 455/323
[58] Field of Search ............ 358/166, 167, 186, 188, 358/195.1, 905, 140; 455/63, 68, 70, 71, 295, 296, 307, 313, 323

[56] References Cited
U.S. PATENT DOCUMENTS
4,951,146  8/1990  Citta .................................. 358/186

Primary Examiner—James J. Groody
Assistant Examiner—Mark R. Powell

[57] ABSTRACT

A television transmission system includes a transmitter that transmits a digital video signal, including an error code, that is dispersed in one sense and a receiver having a selectively reversible complementary dispersal filter and an error detection circuit for recovering the transmitted signal. The error rate of the received signal is used to automatically select the correct sense of the receiver dispersal filter.

11 Claims, 2 Drawing Sheets

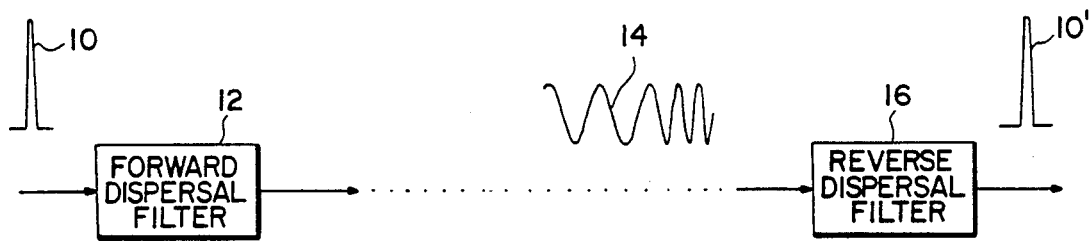
FIG. 1
(PRIOR ART)
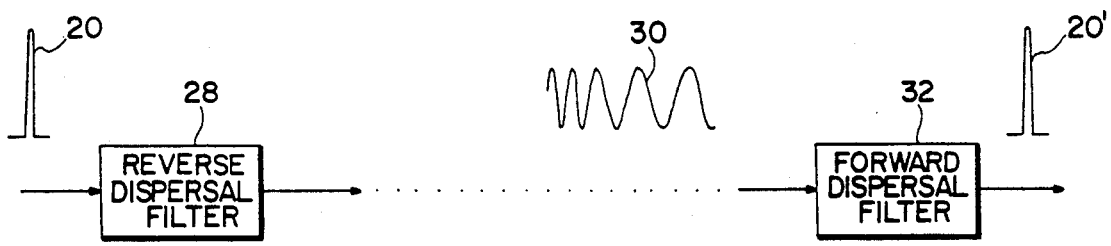
FIG. 2
(PRIOR ART)
FIG. 3
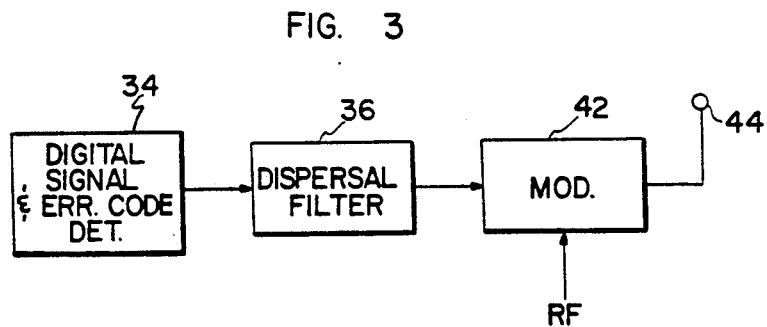

DIGITAL VIDEO SIGNAL TRANSMISSION SYSTEM USING REVERSIBLE DISPERSIVE FILTERS

BACKGROUND OF THE INVENTION AND PRIOR ART

This invention relates generally to television signal transmission methods and systems and specifically to a novel television signal transmission method and system that has improved noise performance and minimal interference potential.

U.S. Pat. No. 4,951,146, issued Aug. 21, 1990 to the inventor, entitled DIRECTIONALLY CONTROLLED DISPERSIVE FILTERING FOR REDUCING CO-CHANNEL INTERFERENCE, and assigned to Zenith Electronics Corporation, teaches how to minimize interference from other transmitted television signals by using dispersal filters of opposite senses in the transmitter and receiver. The role of dispersal filtering to reduce peak signal amplitudes and thereby reduce the interfering effects of such signals is also described. The system utilizes data to identify the sense of the dispersal filter used at the transmitter, which data is detected by the receiver and used to control the sense of the dispersal filter in the receiver.

The present invention is specifically directed to a digital signal transmission method and system which incorporates error correction (error code) for determining the correct sense of a controllable dispersal filter in the receiver to permit recovery of the transmitted signal, thus eliminating the need for separate filter sense identification systems.

OBJECTS OF THE INVENTION

A principal object of the invention is to provide a novel television signal transmission system and method.

Another object of the invention is to provide a television signal transmission system and method having improved noise performance and minimal interference potential.

A further object of the invention is to provide a television signal transmission system that is simple and cost effective.

BRIEF DESCRIPTION OF THE DRAWINGS

These and other objects of the invention will be apparent upon reading the following description in conjunction with the drawings in which:

FIGS. 1 and 2 illustrate the action of dispersal filters in reducing the amplitudes of impulse signals;

FIG. 3 is a simplified block diagram of a transmitter operating in accordance with the invention;

DESCRIPTION OF THE PREFERRED EMBODIMENT

Figure 4:
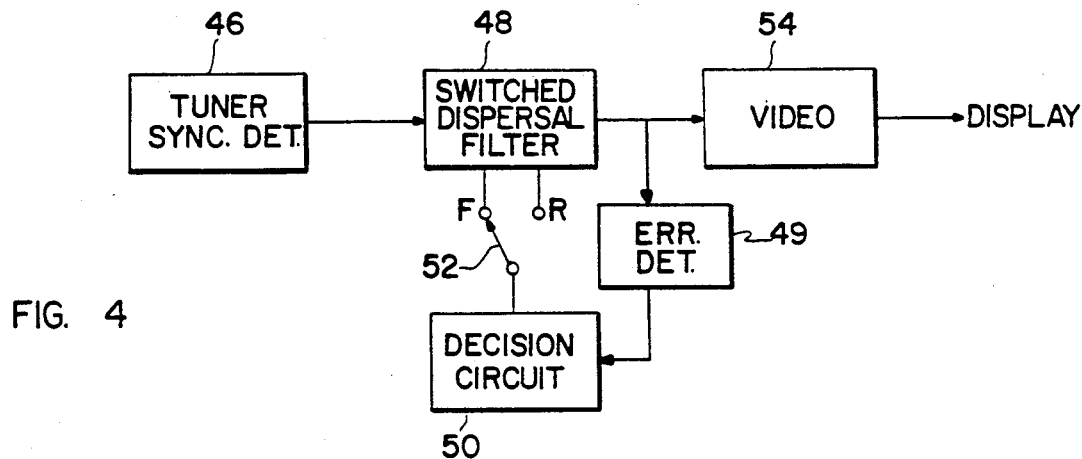
FIG. 4 is a simplified block diagram of a receiver operating in accordance with the invention.

FIG. 1 illustrates a signal impulse 10 that is applied to a forward dispersal filter 12, i.e. a filter operating in one sense, arbitrarily referred to as the forward sense. The output is shown as an idealized waveform 14 which has a much lower amplitude (approximately 24 percent of the amplitude of signal impulse 10) and an increasing frequency over its duration. Waveform 14 is applied to a reverse dispersal filter 16 which is identical in all respects to forward dispersal filter 12 except that it is operated in the opposite sense or direction. The output signal impulse 10' is substantially the same as the input signal impulse 10. In FIG. 2, input signal impulse 20 is applied to a reverse dispersal filter 28 which produces a waveform 30 of opposite configuration, i.e. it is a reverse image of waveform 14. Waveform 30, when applied to an identical dispersal filter 32 operating in the opposite (reverse sense) direction, produces an output signal impulse 20'. In practice, the amplitudes of the dispersed waveforms are not uniform, but are lower at the beginning and at the end of the waveform. The net effect of serially processing a signal through dispersal filters of one sense and of the opposite sense is to recover the original signal.

In FIG. 3, a highly simplified transmitter is shown in block diagram form. A source of a digital data signal 34 representing, for example, a video signal, which includes an error code, is coupled to a dispersal filter 36 which operates in one sense or direction. The dispersed or processed digital signal is supplied to a modulator 42, to which is supplied an RF carrier signal. The dispersed digital signal modulates the RF carrier and is transmitted via an antenna 44. Dispersal filter 36 may have a characteristic similar to that of dispersal filter 12 in FIG. 1 or to that of dispersal filter 28 in FIG. 2.

In FIG. 4 the receiver includes a tuner/synchronous detector 46 that receives signals transmitted from the transmitter in FIG. 3. While the synchronous detector 46 is a preferred detection means, it should not be considered limiting of the invention. The output of the synchronous detector 46 is supplied to a switchable dispersal filter 48 that in turn supplies a video processing circuit 54 that includes well known apparatus for amplifying the video signal to a level sufficient for driving a display (not shown), such as a conventional cathode ray tube. The output of dispersal filter 48 is also applied to an error detection circuit 49 which is coupled to a decision circuit 50. Decision circuit 50 develops an output when a predetermined error threshold is passed. Thus, if the number of errors detected in a given time period exceeds a certain level, decision circuit 50 causes a switch 52 to change the sense of the dispersal filter 48. The error detector code may be any of a well known number of error protection systems such as a cyclical redundant code (CRC). The action of decision circuit 50 is illustrated schematically by switch 52 that is switchable between two terminals labelled F (forward) and R (reverse), respectively.

It will be readily appreciated that the transmitted digital signal, which has been dispersed through a filter of one sense, will produce a great many errors when processed in a receiver in which the sense of the dispersal filter is reversed. Therefore decision circuit 50 will cause a reversal of the sense of the receiver dispersal filter based upon the large number of errors detected. This is a very simple technique for recovering the signal.

As is discussed in the above-mentioned patent, operation of the transmitter dispersal filter in one direction and the complementary receiver dispersal filter in the opposite direction enables minimization of signal peaks thus producing a transmitter having less interference-causing potential and a receiver that is more immune to noise or other signals in the same vicinity. Also, as discussed in the above-mentioned patent, dispersal filters useful with the invention may be constructed in a variety of ways. For example, digital type dispersal filters are known. Another, relatively simple and economically attractive construction uses SAW technology which has long been used in television circuitry.

Figure 5:
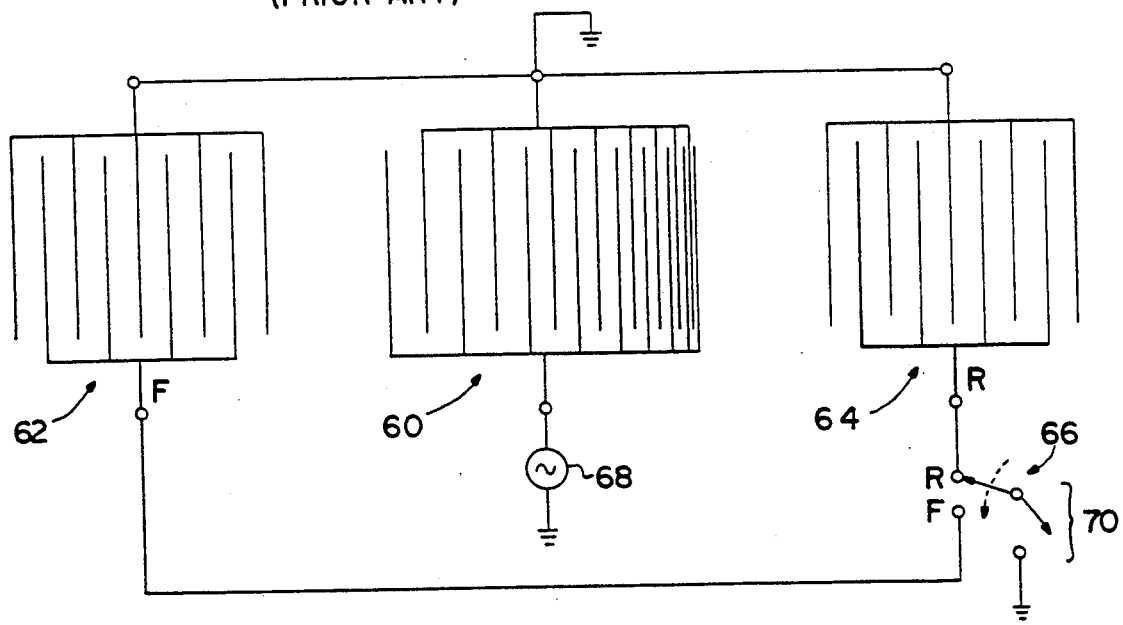
FIG. 5 illustrates a SAW implementation of a directional dispersal filter.

In FIG. 5, a comb 60 is arranged with its fingers spaced in a manner so as to produce a dispersed characteristic to either impinging waves or to waves that are launched on the substrate (not shown) upon which the comb is formed. A signal source 68 is coupled across comb 60, which signal source may represent the input dispersed video signal in a receiver. Comb 60 is flanked on each side by identical uniform transducers, or combs, 62 and 64 for receiving acoustic surface wave signals launched by comb 60. Comb 62 is connected to a switch terminal labelled F and comb 64 is connected to a switch terminal labelled R. A single pole switch 66, movable between terminals F and R, has its output labelled 70. With source 68 being the input from a detector, switch 66 would select whether the dispersal filter was to operate in the direct or reverse mode. For example, due to the spacing of its fingers, launched waves from comb 60 would be received by comb 62 with one sense while the same launched wave from comb 60 will be received by comb 64 in the opposite sense. Therefore, placing switch pole 66 in contact with the F or the R terminal determines the sense of the output signal at output 70. A similar arrangement would be applicable to the use of a switched filter in a transmitter.

It is recognized that numerous changes in the described embodiment of the invention will be apparent to those skilled in the art without departing from its true spirit and scope. The invention is to be limited only as defined in the claims.

What is claimed is:

1. A method of operating a television signal transmission system comprising:
   transmitting an error protected digital signal that has been processed through a dispersal filter of one sense;
   receiving and detecting said transmitted signal;
   processing said received signal through a receiver dispersal filter and error detecting the result; and
   controlling said receiver dispersal filter as a function of errors detected.

2. The method of claim 1 further including selectively controlling the sense of said receiver dispersal filter as a function of the number of errors detected, for recovering said signal.

3. The method of claim 2 wherein said receiver dispersal filter comprises an acoustic surface wave device having a central comb flanked by a pair of symmetrically disposed switchable combs.

4. A television signal transmission system comprising:
   a source of digital signal including an error code;
   a first dispersal filter;
   means for processing said digital signal and said error code with said first dispersal filter to develop a dispersed digital signal;
   means for transmitting said dispersed digital signal to a receiver;
   means for receiving and detecting said dispersed digital signal;
   a second dispersal filter;
   error detection means; and
   means for processing said detected dispersed signal with said second dispersal filter and said error detection means to recover said video signal.

5. The system of claim 4 wherein said first dispersal filter has a first operating sense and said second dispersal filter has a second operating sense that is opposite to said first operating sense.

6. The system of claim 5 herein said receiving means includes switching means for selectively changing the operating sense of said second dispersal filter and further including means responsive to said error detection means for controlling said switching means.

7. The system of claim 6 wherein said second dispersal filter comprises a SAW device with a pair of switchable combs symmetrically disposed on each side of a central comb.

8. A television signal transmission system comprising:
   at a transmitter:
   a source of digital signal having an error detecting code;
   a first dispersal filter of a given operating sense;
   means for processing said digital signal and said error detecting code with said first dispersal filter to develop a dispersed digital signal;
   means for transmitting said dispersed digital signal to a receiver;
   at a receiver;
   means for receiving and detecting said dispersed digital signal;
   a second dispersal filter;
   means for applying said detected dispersal signal to said second dispersal filter;
   means for error detecting the output of said second dispersal filter; and
   means for changing the operating sense of said second dispersal filter in response to said error detecting means.

9. A receiver for processing a digital video signal, including an error code, that has been processed through a transmitter dispersal filter comprising:
   means for receiving and detecting said dispersed digital video signal;
   means for applying said dispersed digital video signal to a receiver dispersal filter complementary to said transmitter dispersal filter;
   means for detecting errors in the signal from said receiver dispersal filter; and
   means for selectively changing the sense of said receiver dispersal filter in response to said error detection means.

10. The receiver of claim 9 wherein said selectively changing means comprises switching means operated for reversing the sense of said receiver dispersal filter when said error detecting means detects a given number of errors in said signal from said receiver dispersal filter.

11. The receiver of claim 10 wherein said receiver dispersal filter comprises an acoustic surface wave device having a central comb flanked by a pair of symmetrically disposed switchable combs.

* * * * *